United States Patent [19]
Kosugi et al.

[11] Patent Number: 5,511,429
[45] Date of Patent: Apr. 30, 1996

[54] METHOD AND SYSTEM FOR MEASURING THREE-DIMENSIONAL DISPLACEMENT

[75] Inventors: Masayuki Kosugi, Ibaraki; Akio Tamai, Chiba, both of Japan

[73] Assignees: Obayashi Corporation, Osaka; Agency of Industrial Science and Technology, Tokyo, both of Japan

[21] Appl. No.: 277,520

[22] Filed: Jul. 19, 1994

[30] Foreign Application Priority Data

Dec. 8, 1993 [JP] Japan .................................. 5-308277
Mar. 14, 1994 [JP] Japan .................................. 6-042830

[51] Int. Cl.$^6$ ........................................ G01B 5/00
[52] U.S. Cl. ........................................ 73/784
[58] Field of Search ................... 73/151, 784, 786; 340/690; 33/DIG. 1, DIG. 21, 544; 356/373; 324/207.23

[56] References Cited

U.S. PATENT DOCUMENTS

| | | | |
|---|---|---|---|
| 4,627,734 | 12/1986 | Rioux | 356/373 |
| 4,813,278 | 3/1989 | Kosugi | 73/784 |
| 5,113,707 | 5/1992 | Herget | 73/784 |
| 5,301,003 | 4/1994 | Ikeda | 356/356 |

*Primary Examiner*—Robert Raevis
*Attorney, Agent, or Firm*—Wenderoth, Lind & Ponack

[57] ABSTRACT

A three-dimensional displacement measuring system measures the three-dimensional displacement of a mass such as rock. A first cylindrical member is provided as a displacement indicating device and is arranged on one side of a discontinuous surface, such as a crack, in a bore hole in the rock. The bore hole extends across the discontinuous surface. A second cylindrical member is provided as a displacement measuring device on the other side of the discontinuous surface and is free to displace relative to the mass and the first cylindrical member and is located opposite to the first cylindrical member.

26 Claims, 7 Drawing Sheets

HEMISPHERE

CONICOID

HYPERBOLOID

TRUNCATED CONICAL

TRIANGULAR PYRAMID

CONICAL

PYRAMID $t(r, \theta, a, b, c) = 0$

METHOD AND SYSTEM FOR MEASURING THREE-DIMENSIONAL DISPLACEMENT

BACKGROUND OF THE INVENTION

1. Field of the Invention

The present invention relates generally to a method and a system for measuring three-dimensional displacement of a mass. More specifically, the invention relates to a method and a system suitable for measuring three-dimensional displacement of a discontinuous surface, such as a crack in a rock or a natural joint and so forth.

2. Description of the Related Art

Conventionally, in fields of mechanical engineering, civil engineering and so forth, a non-contact type distance measuring equipment, such as a laser type displacement gauge, or a contact type displacement gauge employing a differential transformer and so forth are used practically. Namely, this measuring equipment performed high precision measurement of the displacement of a mass as an object of measurement (hereinafter referred to as a measuring object) as a relative displacement from a reference portion where various displacement gauges are placed.

Also, particularly in the field of civil engineering and mining, or in the field of geophysics, measurement of the displacement of a foundation, such as a rock, is performed for appropriately evaluating behavior of rock or crust. As a method for measuring the displacement of the foundation, a measuring method employing an extensometer is typically employed. Namely, this method makes analysis of the displacement of the foundation by setting a fixed measuring point within a bore hole formed in the foundation, such as the rock, and measuring a variation of a distance between the fixed measuring point and a measuring point located at the opening end of the bore hole on the earth by means of the extensometer.

However, when the displacement of the mass is measured by the conventional measuring system and method, the relative displacement from the reference portion where the displacement gauge is located is merely measured as a linear relative displacement. Therefore, in order to measure the three dimensional displacement of the mass, displacement measurements are by means of a plurality of measuring apparatus which are arranged three-dimensionally. This makes installation of the measuring apparatuses and collection of measured data complicated.

Furthermore, in particular when three-dimensional behavior of the foundation is to be evaluated by the extensometer, since the measuring method employing the extensometer permits only evaluation of relative linear displacement between two measuring points along an axis of the bore hole, it is inherent to three-dimensionally arrange a plurality of bore holes to perform multi-axes and multi-point measurement for three-dimensional evaluation. In addition, in the method, it is not possible to instantly detect the behavior of a discontinuous surface, such as a crack of the rock, a natural joint and or so forth, which sensitively reflects variations of the stress condition of the foundation.

Namely, in the conventional method employing the extensometer, a problem is encountered by requiring a huge amount of experiments for performing multi-axis and multi-point measurement for evaluating the three-dimensional behavior of the foundation. Also, the conventional method cannot make analysis of the behavior by specifying the discontinuous surface, but rather unitarily evaluates deformation of the discontinuous surface associating with variation of the stress condition in the foundation and displacement of the foundation as a continuous body. Therefore, it is not possible to perform evaluation by specifying deformation of the discontinuous surface primarily determining deformation of the foundation. In the prior art, a further problem is encountered in the impossibility of proper evaluation of the relationship between the behavior of the overall foundation and the behavior of the discontinuous surface, deformation direction, and deformation magnitude.

SUMMARY OF THE INVENTION

The present invention has been worked out in view of the problems set forth above, and, therefore, it is an object of the present invention to provide a method and a system for measuring three-dimensional displacement which do not require displacement measurement with a three-dimensionally arranged plurality of measuring apparatuses and can easily measure three-dimensional displacement of a mass.

Another object of the present invention is to provide a three-dimensional displacement measuring system which can easily evaluate three-dimensional behavior of a foundation without requiring multi-axis and multi-point measurement and which permits high precision and effective evaluation of the deformation of the foundation by specifically measuring the deformation of a discontinuous surface primarily determining most of deformation of the foundation.

In order to accomplish the above-mentioned and other objects, a method for measuring three-dimensional displacement of a mass, according to one aspect of the present invention, comprises the steps of:

providing a displacement indicating means placed on an end surface of the mass for reflecting at least a fraction of three-dimensional displacement of the mass;

arranging a displacement measuring means for free displacement relative to the mass and in opposition to the displacement indicating means; and measuring three-dimensional relative displacement of the mass by detecting relative displacement of the displacement indicating means relative to the displacement measuring means by the latter.

In one embodiment in one aspect of the invention set forth above, the displacement indicating means may comprise a concave surface formed of a curved surface converging from the opening end to the bottom. On the other hand, the displacement measuring means may comprises displacement measuring equipment arranged in opposition to the concave surface and measuring the relative distance to the concave surface along a circumferential trace by rotating about a center axis of the concave which maintains a given tilt angle relative to the center axis for circumferentially scanning the concave surface. Also, the method may include a step of analyzing the displacement of the circumferential trace on the concave surface associated with the displacement of the mass, on the basis of the relative distance measured by the displacement measuring equipment.

When the above-mentioned method is applied for the measurement of the displacement of a rock, the mass may comprise a first cylindrical member arranged at one side of a discontinuous surface in a bore hole formed across the discontinuous surface, and the displacement measuring equipment may comprise a second cylindrical member positioned at the other side of the discontinuous surface. The displacement measuring equipment measures displacement of the first cylindrical member across the discontinuous surface, relative to the second cylindrical member. The discontinuous surface may be a crack in a rock, and the displacement of the rock at the crack is detected by measuring displacement of the first cylindrical member relative to the second cylindrical member.

In another embodiment of one aspect of the invention, which is intended to be applied for measurement of the displacement of the rock exclusively, the mass may comprise a first cylindrical member arranged at one side of a discontinuous surface in a bore hole formed across the discontinuous surface. The displacement indicating means may comprise at least three surface members mounted on the end surface of the first cylindrical member and respectively oriented in mutually perpendicular directions. The displacement measuring means may comprise at least three displacement measuring apparatus arranged at the other side of the discontinuous surface in opposition to the three surface members, respectively, and directly detecting displacement of the corresponding surface members. The discontinuity is a crack in a rock, and the displacement of the rock at the crack is detected by measuring the displacement of the surface members.

The displacement measuring equipment may be mounted in a second cylindrical member positioned at the other side of the discontinuous surface. The method may further comprise the steps fixing the first and second cylindrical members on a guide means for restricting relative displacement between the first and second cylindrical members, inserting an assembly of the first and second cylinder members fixed on the guide member into the bore hole and shifting the assembly within the bore hole for positioning the first cylindrical member at one side of the discontinuous surface and the second cylindrical member at the other side of the discontinuous surface, releasing the first and second cylindrical members from the guide means and fixing in the bore hole, and removing the guide member from the bore hole.

According to another aspect of the invention, a three-dimensional displacement measuring system comprises:

a displacement indicating means placed on an end surface of a mass for reflecting at least a fraction of three-dimensional displacement of the mass;

a displacement measuring means arranged for free displacement relative to the mass and in opposition to the displacement indicating means for measuring three-dimensional relative displacement of the mass by detecting relative displacement of the displacement indicating means relative to the displacement measuring means.

In one embodiment of the second aspect of the invention, the displacement indicating means may comprise a concave surface formed of a curved surface converging from the opening end to the bottom. On the other hand, the displacement measuring means may comprise a displacement measuring apparatus or device arranged in opposition to the concave surface and measuring the relative distance to the concave surface along a circumferential trace by rotating about a center axis of the concave while maintaining a given tilt angle relative to the center axis for circumferentially scanning the concave surface. The system may further comprise means for analyzing the displacement of the circumferential trace on the concave surface associated with the displacement of the mass, on the basis of the relative distance measured by the displacement measuring equipment.

The displacement measuring equipment may comprise a non-contact type measuring equipment which does not contact with the concave surface. The non-contact type measuring equipment may be a laser displacement gauge radiating a laser beam oblique to the center axis of the concave surface, for example. The displacement measuring equipment may include a rotary table having a rotary shaft arranged in alignment with the center axis of the concave surface and driven by a motor, with the laser displacement gauge mounted on the rotary table.

In another embodiment of the second aspect of the invention, the mass may comprise a first cylindrical member arranged at one side of a discontinuous surface in a bore hole formed across the discontinuous surface. The displacement indicating means may comprise at least three surface members mounted on an end surface of the first cylindrical member and respectively oriented in mutually perpendicular directions. The displacement measuring means may comprise at least three displacement apparatus arranged at the other side of the discontinuous surface in opposition to the three surface members, respectively, and directly detecting displacement of corresponding surface members.

The displacement measuring equipment may comprise at least one differential transformer displacement sensor contacting a surface member. In one example, the differential transformer displacement sensor comprises measuring elements constantly maintained in contact with the surface members and a differential transformer portion connected to the measuring elements.

Preferably, the displacement measuring equipment is mounted in a second cylindrical member positioned at the other side of the discontinuous surface. The first and second cylindrical members may have fixing means press fitted onto the peripheral wall surface of the bore hole for fixing the first and second cylindrical members within the bore hole. The fixing means may comprise a fixing rod extending slidably and radially through each of the cylindrical members.

In the further preferred construction, the system may further comprise a guide means on which the first and second cylindrical members are fixed by means of the fixing rod. The first and second cylindrical members are guided in the bore hole in a position fixed on the guide means are restricted in relative displacement to each other. Releasing and fixing of the cylindrical member is done by sliding the fixing rod.

Other objects, features and advantages of the present invention will become clear from the detailed description given hereinafter with reference to the accompanying drawings.

BRIEF DESCRIPTION OF THE DRAWING

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The preferred embodiments of a three-dimensional displacement measuring system and method will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail so that the present invention is not unnecessarily obscure.

Figure 1:
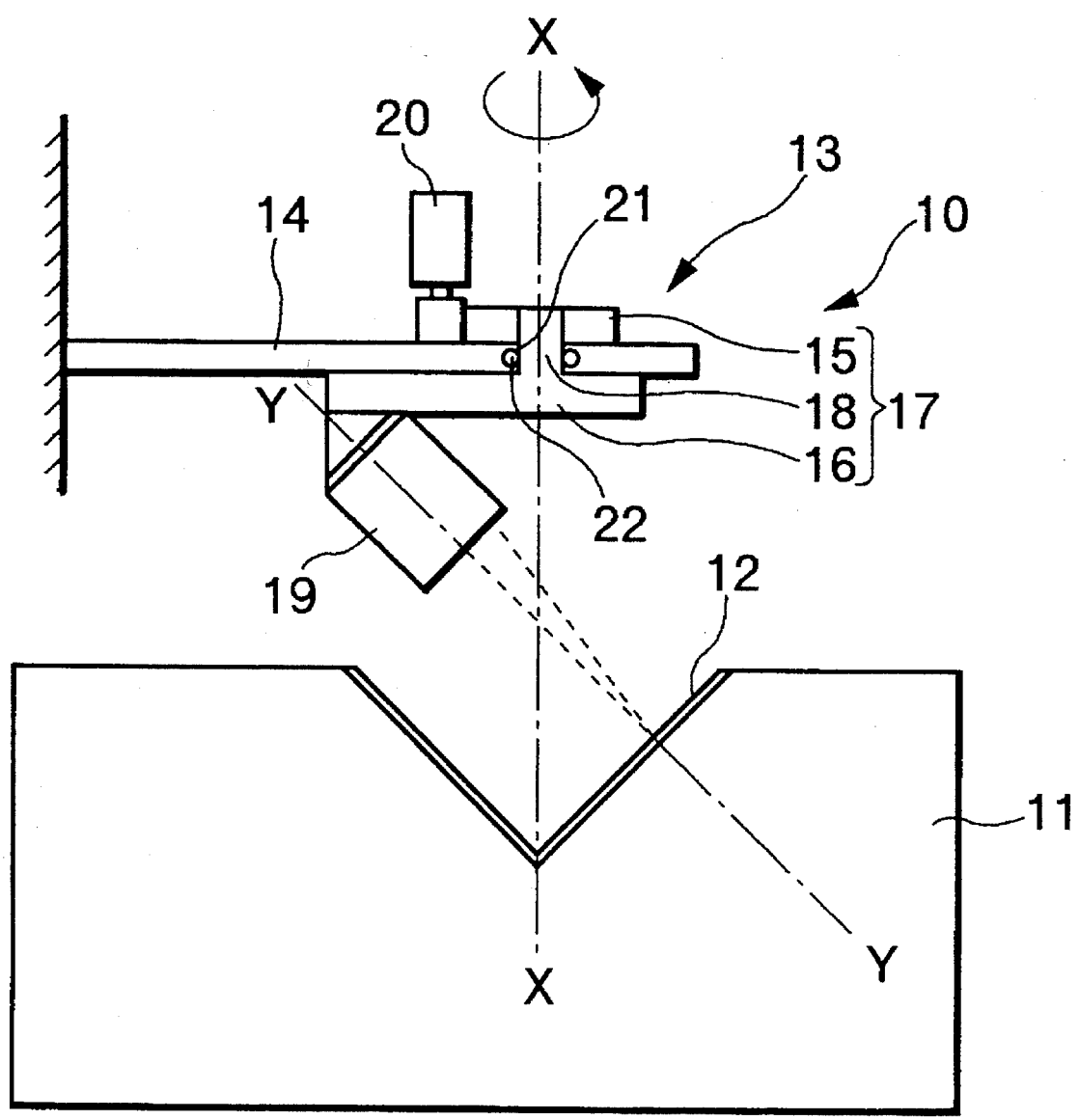
FIG. 1 is an explanatory illustration showing a manner of measuring three-dimensional displacement of a mass by means of one embodiment of a three-dimensional displacement measuring system according to the present invention.

FIG. 1 shows a manner of measurement of a three-dimensional displacement of a rigid block 11 as a measurement object employing a first embodiment of a three-dimensional displacement measuring system 10 according to the present invention. The three-dimensional displacement measuring system 10 comprises a concave surface 12 formed on the rigid block 11, and a displacement measuring apparatus 13 provided above the opening portion of the concave surface 12 and supported by a stationary base 14 in opposition to the concave surface 12.

Figure 2:
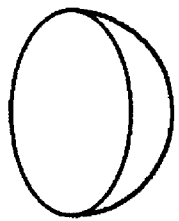
FIG. 2 is an illustration showing an example of a curved plane forming a concave surface.
Figure 2:
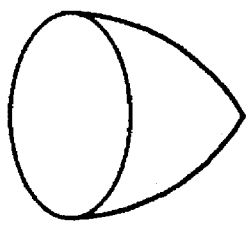
Figure 2:
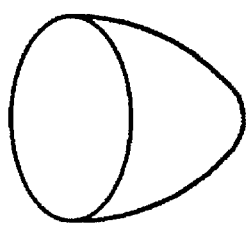
Figure 2:
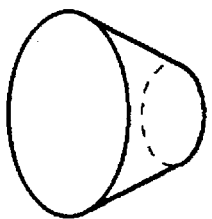
Figure 2:
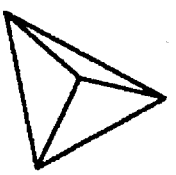
Figure 2:
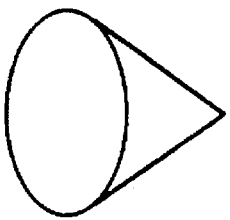
Figure 2:
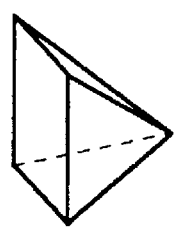

The concave surface 12 converges toward a bottom thereof from the opening portion and is formed of a curved surface expressed by a mathematical equation. For example, as shown in FIG. 2, the concave surface may define the configuration of a conical or truncated conical surface, or a hyperboloid, conicoid, hemisphere, pyramid or, triangular pyramid, etc. Also, the concave surface 12 is processed by surface finishing to provide a smooth surface so that a distance measurement by means of a laser displacement gauge 19, which will be discussed later, can be performed accurately.

On the other hand, the displacement measuring apparatus 13 comprises an upper rotary disc 15 and a lower rotary disc 16 arranged at opposite sides of the stationary base 14 so as to form a rotary table 17 rotatable about a rotary shaft 18 positioned in alignment with a center axis X of the concave surface 12, and the laser displacement gauge 19 mounted on the lower rotary disc 18. The rotary table 17 is driven by a rotation control motor 20 via the upper rotary disc 15 engaging with the motor. The laser displacement gauge 19 is mounted in an orientation directed in a direction Y which is oblique to the center axis X of the concave surface 12. By this arrangement, a laser beam irradiated from the laser displacement gauge 19 impinges on the curved surface forming the concave surface 12 and is then reflected to return to the laser displacement gauge 19. By this, a relative distance between the laser displacement gauge and a reflection point is determined. It should be noted that such a type of the laser displacement gauge is per se known in the art. According to rotation of the rotary table 17, the center axis of the laser displacement gauge 19, namely the irradiation axis Y of the laser beam, is shifted in the circumferential direction while defining a conical trace. On the other hand, the reflection point of the laser beam defines a circular trace on the concave surface 12 by rotatably scanning the laser beam on the concave surface. The rotary shaft 18 of the rotary table 17 extends through a through hole 21 defined in the stationary base 14. A ball bearing 22 is disposed within the through hole 21 for permitting smooth rotation of the rotary table 17.

With the shown embodiment of the three-dimensional displacement measuring system 10, three-dimensional displacement can be detected, including back and forth displacement, a left and right displacement, rotational displacement of the rigid block 11. Namely, when displacement is caused in the rigid block 11, the trace of the intersection between the circumferentially shifting laser beam defining a conical trace and the concave surface 12 having a particular surface configuration, such as a conical surface configuration, a hyperboloid surface configuration and so forth, i.e. the trace of the reflection point of the laser beam, shifts three-dimensionally. The displacement of the trace of the laser beam reflection point on the concave surface 12 is analyzed according to the following principle for easily measuring the displacement of the rigid block 11 as a relative displacement from the displacement measuring apparatus 13.

The principle of deriving the displacement of the rigid body 11 is as follows. Here, for the purpose of disclosure, rotational displacement of the rigid block will be ignored for simplification of the disclosure. However, it is, of course, possible to perform the deviation which taking the rotational displacement of the rigid body into account.

Figure 3A:
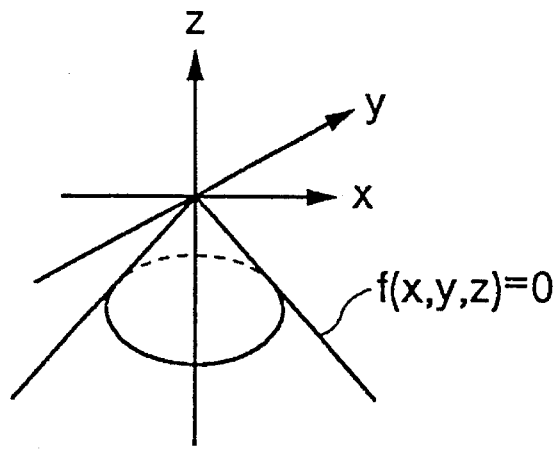
FIGS. 3(A) to 3(D) are illustrations explaining principles of measurement of three-dimensional displacement of the mass with the present invention.

1) Assuming the trace defined by the irradiation axis Y of the laser beam is expressed by an equation for conical configuration as follow:

$$f(x,y,z)=0 \text{(FIG. 3(A))}$$

Figure 3B:
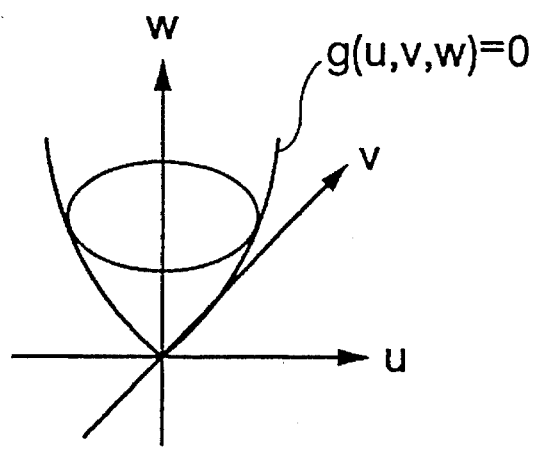
Figure 3C:
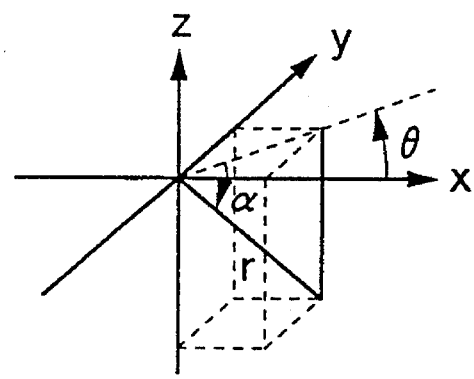
Figure 3D:
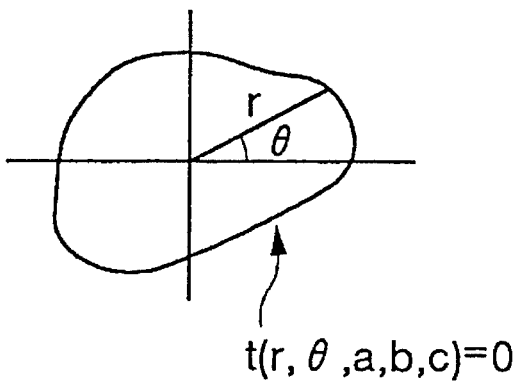

2) The equation of the concave surface 12 arranged in opposition to the laser displacement gauge is expressed by:

$$g(u,v,w)=0 \text{(FIG. 3(B))}$$

3) Z axis is parallel to w axis.
Under the condition set forth above, a relationship of both coordinate axes can be expressed by:

$$x=u+a$$
$$y=v+b$$
$$z=w+c$$

(where, a, b, c are offset in x direction, y direction and z direction of the coordinate center of (u, v, w)).

4) By this, the equation of the curve (this expresses the rotational trace of the reflection point) when two curved surfaces intersect is as follow:

$$f(x,y,z)=g(x-a,y-b,z-c)$$

Here, for the purpose of disclosure, it is assumed that (x, y, z, a, b, c)=0

5) Assuming that the length measured by the displacement gauge is r and the angle is θ, the relationship between the distance r, angle θ and (x, y, z) can be expressed as follows:

$$x = r \cdot \cos\alpha \cdot \cos\theta$$

$$y = r \cdot \cos\alpha \cdot \sin\theta$$

$$z = -r \cdot \sin\alpha$$

6) Accordingly, the trace defined on the concave surface 12 by the measured value (r and θ) can be expressed by:

$$h(r \cdot \cos\alpha \cdot \cos\theta, r \cdot \cos\alpha \cdot \sin\theta, -r \cdot \sin\alpha) = 0$$

Therefore, it can be expressed by;

$$t(r, \theta, a, b, c) = 0$$

7) From the measured trace, a, b, c satisfying the foregoing function may be derived by way of an optimization method, such as the method of least squares, and so forth.

8) Since a, b, c can be derived in each measurement, the three dimensional displacement can be easily calculated by comparing a, b, c derived at the respective measurements.

Figure 4:
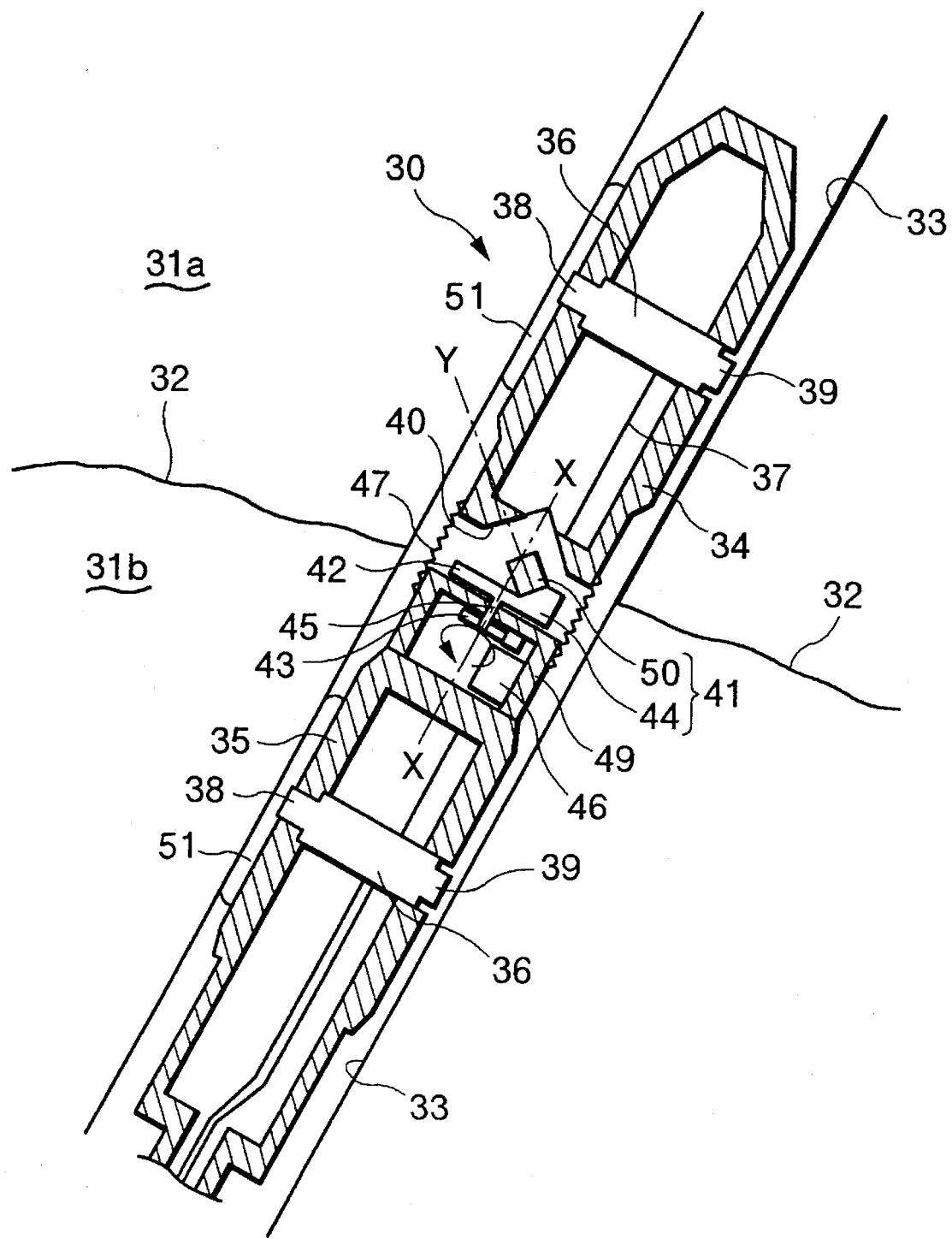
FIG. 4 is a fragmentary illustration showing another embodiment of the three-dimensional displacement measuring system according to the present invention, adapted for measurement of displacement of a discontinuous surface of a rock.

FIG. 4 shows another embodiment of a three-dimensional displacement measuring system 30 according to the present invention. The shown embodiment of the three-dimensional displacement measuring system 30 is intended to be employed in the evaluation of the behavior of a foundation. The three-dimensional displacement measuring system 30 is disposed within a bore hole 33 formed across a discontinuous surface, such as a crack 32 of the rock. The three-dimensional displacement measuring system 30 includes a first cylindrical member 34 as a mass located in one side of the rock 31a and a second cylindrical member 35 located in the other rock 31b opposing to the rock 31a across the crack 32 and following the first cylindrical member 34.

The first cylindrical member 34 defines a concave surface 40 formed with a predetermined curved surface, such as a conical or truncated conical surface, or a hyperboloid, conicoid, hemisphere, pyramid, or triangular pyramid, converging from the opening end to the bottom at the rear end thereof. In the vicinity of the center of the first cylindrical member 34, a radially extending fixing rod 36 is provided. The fixing rod 36 has an expanding and contracting device (not shown) constructed with a combination of a hydraulic cylinder and a spring. The expanding and contracting device is connected to a pressure line 37 to receive a hydraulic pressure controllably supplied from a working base at the opening end of the bore hole 33 on the earth. The expanding and contracting device is responsive to the hydraulic pressure supplied through the pressure line 37 to drive a fixing pin 38 and a hole wall abutment 39 provided at both axial ends of the fixing rod 36 to cooperatively extend from or contract into the fixing rod. Namely, when the fixing pin 38 is driven toward the left to protruded, the hole wall abutment 39 is driven to be retracted.

On the other hand, at the tip end of the second cylindrical member 35, a displacement measuring apparatus 41 is mounted in opposition to the concave surface 40 formed at the rear end of the first cylindrical member 34. The displacement measuring apparatus 41 comprises a rotary table 44 rotatably supported on a support frame 49 mounted on the tip end surface of the second cylindrical member 35, and a laser displacement gauge 50 fixed on the rotary table. The rotary table 44 has a front rotary disc 42 and a rear rotary disc 43 mutually coupled through a rotary shaft 45 extending in alignment with the center axis X of the concave surface 40. The rotary table 44 is rotatably driven by a rotation control motor 46 engaging with the rear rotary disc 43. The laser displacement gauge 50 is mounted on the front rotary disc 42 and oriented to direct the laser beam axis Y in obliquely to the center axis X of the concave surface 40. The laser beam radiated from the laser displacement gauge 50 impinges on the curved surface forming the concave surface and is reflected thereon. The laser beam axis Y is shifted according to rotation of the rotary table 44, defining a substantially conical trace. Therefore, by circumferential scanning of the laser beam on the concave surface 40, the reflecting point is shifted to form a circular trace. On the other hand, in the vicinity of the axial center position, a fixing rod 36 having an identical construction to that provided in the first cylindrical rod 34 is provided.

Within a gap between the first cylindrical member 34 and the second cylindrical member 35, a membrane wall 47, a water-tight seal member, is mounted surrounding the concave surface 40 and the displacement measuring apparatus 41 for protecting the latter. Also, on the external surfaces of the first and second cylindrical members 34 and 35, a plurality of supporting legs 51 are arranged with a given interval in the circumferential direction at both circumferential sides of the fixing pins 38 of the fixing rods 36. These supporting legs 51 are cooperative with the hole wall abutments 39 of the fixing rod 36 when the hole wall abutments 39 are projected from the fixing rod to abut against the hole wall so as to fix the first and second cylindrical members 34 and 35 at respective predetermined positions within the bore hole 33.

For analyzing the behavior of the crack 32 in the rock by the three-dimensional displacement measuring system 30, the three-dimensional displacement measuring system 30 is initially set in respective opposing predetermined positions in the rocks 31a and 31b across the crack 32. Upon installation, the first and second cylindrical members 34 and 35 are integrally secured on a carriage having a sliding mechanism, such as wheels or casters. The first and second cylindrical members 34 and 35 are secured on the carriage by projecting the fixing pins 38 of the fixing rods 36 and engaging the fixing pins to the carriage. The first and second cylindrical members 34 and 35 with the carriages are pushed into the bore hole 33 place them at the respective predetermined positions. Thereafter, hydraulic pressure is supplied to the expanding and contracting devices in the fixing rods 36 via the pressure lines 37 to force the hole wall abutments 39 to firmly abut on the peripheral wall of the bore hole 33 to fix the first and second cylindrical members 34 and 35 at the respective predetermined positions. It is preferred to mount a bore hole television camera or the like on the carriage so as to facilitate retrieval of the crack 32. Furthermore, by mounting the bore hole television camera the first and second cylindrical members 34 and 35 may be accurately fixed at the predetermined positions. At the same time as fixing the three-dimensional displacement measuring system 30 within the bore hole 33, the fixing pins 38 are driven to be retracted to release the first and second cylindrical members 34 and 35 from the carriage. Therefore, the carriage can be easily removed from the bore hole 33. It should be noted that installation of the measuring equipment at the predetermined positions will be described in a more concrete manner in another embodiment discussed later.

After installation of the three-dimensional displacement measuring system 30 at the predetermined positions, the relative displacement between the first cylindrical member 34 positioned within the one rock 31a and the second cylindrical member 35 positioned within the other rock 31b is measured for making an analysis of the specified crack 32.

Namely, when the rocks opposing each other across the crack are relatively displaced, the first and second cylindrical members 34 and 35 are similarly displaced relative to each other. Therefore, similar to the embodiment of FIG. 1, the trace of the intersection between the laser beam axis Y shifted to define a conical trace and the concave surface 40, namely the circular trace of the reflection point, is displaced three-dimensionally. It should be appreciated that the three-dimensional displacement measuring system 30 is connected to a CPU (not shown) for performing measurement control, arithmetic operations, data file management and so forth, a data recording memory (not shown) and so forth via various connection lines so that analysis of the behavior of the crack 32 can be instantly performed. With the three-dimensional displacement measuring system 30 constructed as set forth above, by specifying the crack 32, which primarily determines most of deformation of the foundation, as the discontinuous surface, the behavior of the crack can be easily analyzed with high precision to facilitate evaluation of the three-dimensional behavior of the foundation.

It should be noted that while the foregoing embodiments are discussed in terms of the use of the known laser type displacement gauge as the displacement gauge, it is possible to employ other non-contact type distance measuring equipment or contact-type displacement gauges, such as one employing a differential transformer. When a contact type displacement gauge is used, it is desirable to provide a rotary ball or the like at the tip end of the displacement gauge so that the displacement gauge may smoothly move on the concave surface 12 or 40 in the circumferential direction.

Figure 6:
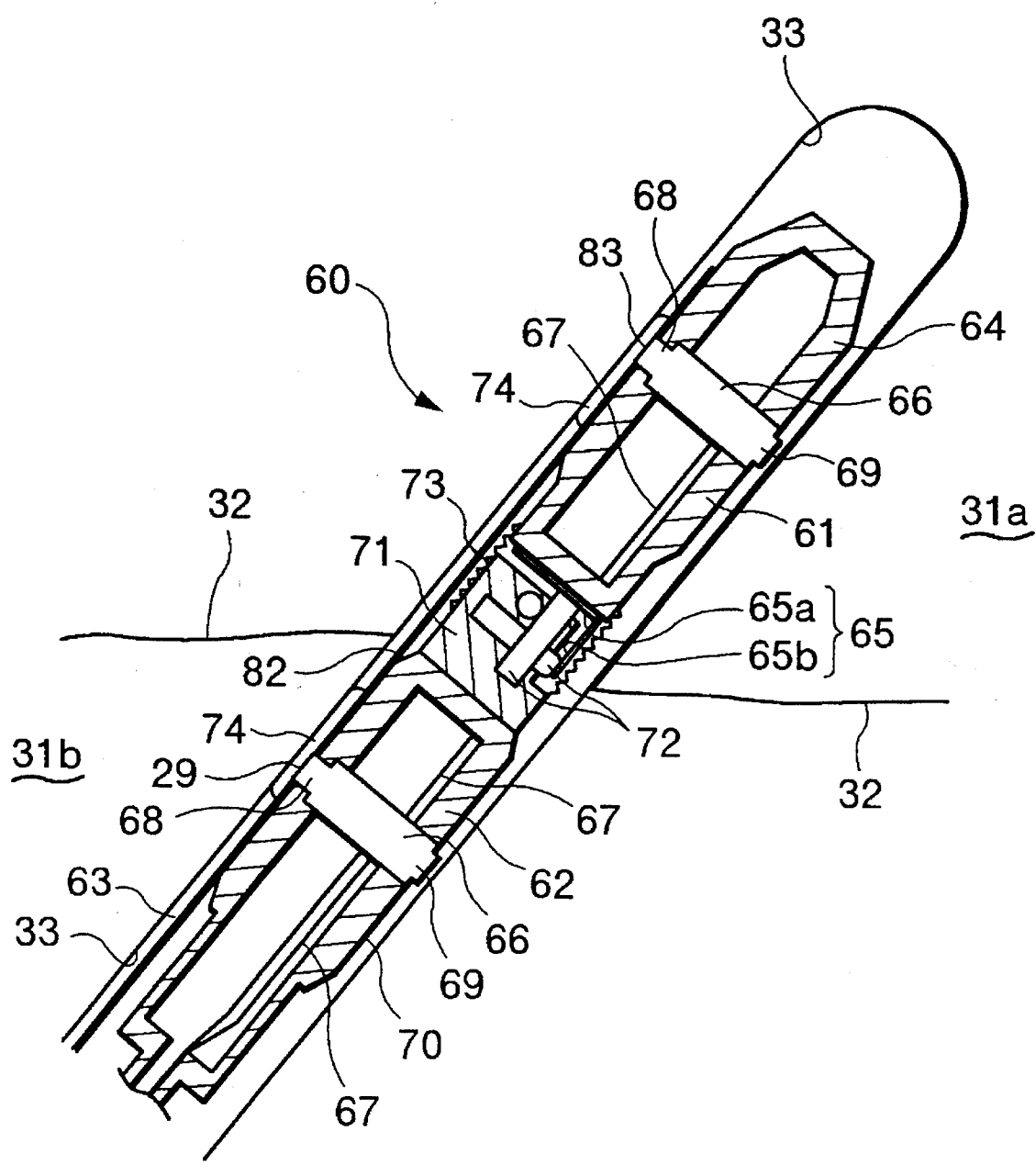
FIG. 6 is an enlarged view of a part of the three-dimensional displacement measuring system of FIG. 5.
Figure 7:
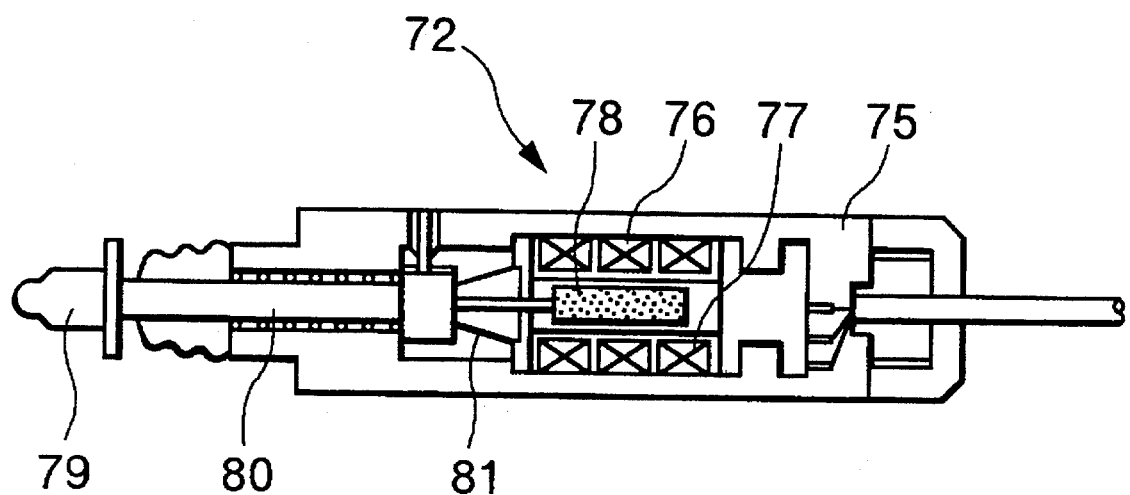
FIG. 7 is a section showing one example of a differential transformer displacement gauge in the three-dimensional displacement measuring system of FIG. 5.

A further embodiment of the three-dimensional displacement measuring system according to the invention will be discussed with reference to FIGS. 5 to 7. The three-dimensional displacement measuring system 60 illustrated in these figures is designed for measuring displacement of the crack 32 in the rock as one example of a discontinuous surface. The three-dimensional displacement measuring system 60 generally comprises a measuring object 61 disposed in the bore hole 33 formed in the rock across the crack 32 and located in the rock 31a positioned at one side of the crack 32, a displacement measuring apparatus 62 located within the rock 31b at the other side of the crack following the measuring object 61, and a fixing guide member 63 detachably attached to the measuring object 61 and the displacement measuring equipment As shown in enlarged section of FIG. 6, the measuring object 61 has a first cylindrical portion having a tip end with a smaller diameter. On the rear end surface of the first cylindrical member 64, a surface member 65a is mounted with its surface oriented in parallel to the rear end surface of the first cylindrical member. Another pair of surface members 65b (only one is shown) are oriented perpendicularly to the surface member 65a and extend rearwardly. The pair of surface members 65b also intersect perpendicularly to each other. The first cylindrical member 64 carries a fixing rod 66. The fixing rod 66 has an expanding and contracting device constructed by a combination of a hydraulic cylinder and a spring. The expanding and contracting device is connected to a pressure line 67 to receive a hydraulic pressure controllably supplied from a working base at the opening end of the bore hole 63 on the earth. The expanding and contracting device is responsive to the hydraulic pressure supplied through the pressure line 67 to drive a fixing pin 68 and a hole wall abutment 69 provided at both axial ends of the fixing rod 66 to cooperatively extend from or contract into the fixing rod. Namely, when the fixing pin 68 is driven to the left to be protruded by application of the hydraulic pressure, the hole wall abutment 69 is driven to be retracted. On the other hand, by releasing the hydraulic pressure, the fixing pin 68 is retracted and the hole wall abutment 69 is projected.

On the other hand, the displacement measuring equipment 62 has a second cylindrical member 70 following the first cylindrical member 64. On the tip end surface (the surface opposite to the rear end surface of the first cylindrical member 64 having the three surfaces i.e. surface members 65a and 65b), a support base 71 is rigidly secured. On the support base 71, three differential transformer displacement sensors (hereinafter referred to as "LVDT displacement sensors) 72 are mounted. Each LVDT displacement sensor 72 is arranged to perpendicularly mate with a corresponding one of the three surfaces of the surface members 65a and 65b. The second cylindrical member 70 also includes a fixing rod 66 having a identical construction to that provided in the first cylindrical member 64. At a gap between the first and second cylindrical members 64 and 70, a membrane wall 73 serving as a water-tight seal is mounted, covering the three surface members 65 and the LVDT displacement sensors 72. On the external surface of the first and second cylindrical members 64 and 70, a plurality of supporting legs 74 are arranged with a given interval in the circumferential direction at both circumferential sides of the fixing pins 68 of the fixing rods 66. These supporting legs 74 are cooperative with the hole wall abutments 69 of the fixing rod 66 when the hole wall abutments 69 are projected from the fixing rod to abut against the hole wall, so as to fix the first and second cylindrical members 64 and 70 at respective predetermined positions within the bore hole 33.

The LVDT displacement sensor 72 is per se known in the art. For example, the LVDT displacement sensor 72 comprises a primary coil 76, a secondary coil 77, a differential transformer portion 75 including a core 78 formed of a magnetic body and disposed at the center of the primary and secondary coils, a measuring element 79, a spindle 80, a measuring pressure spring 81 and so forth. The measuring element 79 is held in contact with the surface members 65a and 65b of the three surfaces 65 and are adapted to be shifted in axial direction according to displacement of the corresponding surface member. The magnitude of shifting of the measuring element 79 is detected by exciting the primary side of the differential transformer portion 75 by an alternating current, generating a secondary signal proportional to the shifting magnitude of the measuring element 79, which is directly connected to the core 78 via the spindle 80, and detecting the secondary signal to output it as a direct current signal indicative of the shifting magnitude of the measuring element 79, which is in turn indicative of the displacement of the three surfaces 65.

The fixing guide member 63 comprises a thin plate member 82 curved along the external surfaces of the first and second cylindrical members 64 and 70. The circumferential width of the plate member 82 is determined so that it may be placed between the support legs 844. Engaging holes 83 for engaging with the fixing pins 68 of the fixing rods 66 are formed in the plate member 82. Therefore, by projecting the fixing pins 68 to engage with the engaging holes 83, the measuring object 61 including the first cylindrical member 64 and the displacement measuring apparatus 62, including the second cylindrical member 70, are fixed on the fixing guide member 63. In this condition, the measuring object and the displacement measuring equipment 62 are fixedly connected to each other and thus prevented from relative displacement. The support leg 74 maintains a clearance between the peripheral wall surface of the bore hole 33 and the external peripheries of the cylindrical members 64 and 70 for protecting the fixing guide member 63 and facilitating withdrawal of the fixing guide member 63.

Figure 5:
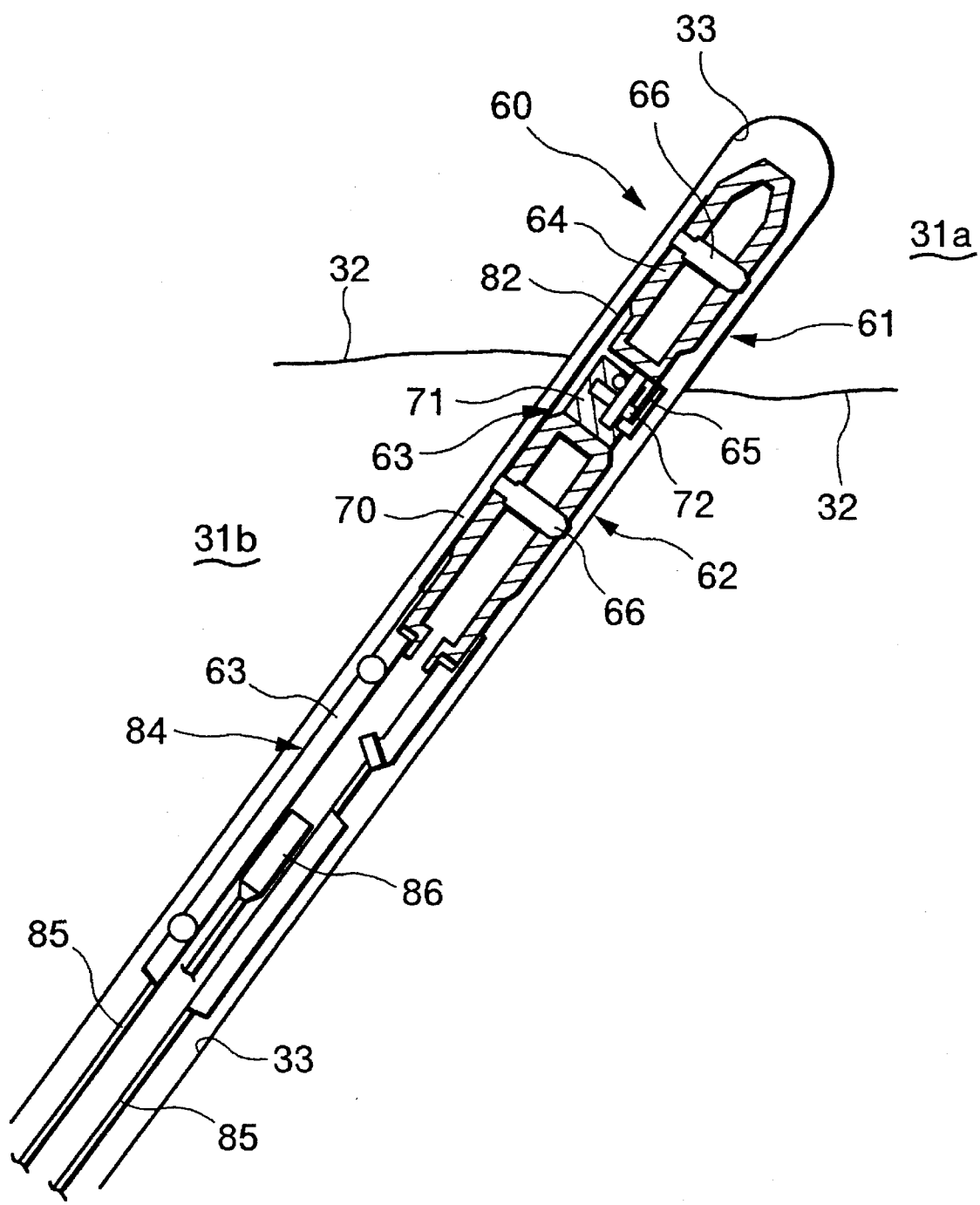
FIG. 5 is a section showing a further embodiment of the three-dimensional displacement measuring system according to the present invention, adapted for measurement of displacement of a discontinuous surface of a rock.

As shown in FIG. 5, a wheeled centrizer 84 is provided in the fixing guide member 63. The plate member 82 described above is extended frontwardly from the wheeled centrizer 84. An extension rod 85 reaching the opening end of the bore hole is connected to the wheeled centrizer 84. Also, the wheeled centerizer 84 carries a bore hole television camera 86 for visually monitoring the wall surface of the bore hole 33.

It should be noted that the LVDT sensor 72 of the displacement measuring equipment 62 is connected to an amplifier of the LVDT displacement sensor, an A/D converter, a CPU for performing measuring control and data file management, a data memory and so forth via various connection lines.

For measuring the displacement of the crack 32 in the rock employing the three-dimensional displacement measuring system 60 as set forth above, the three-dimensional displacement measuring system 60 is disposed within the bore hole 33 across the crack 32. The installation of the three-dimensional displacement measuring system is performed through the following process. The measuring object 61 and the displacement measuring apparatus 62 are inserted into the bore hole 33 in a condition fixed to each other by the fixing guide member 63. By connecting extension rods 85, the assembly of the measuring object 61 and the displacement measuring apparatus 62 are pushed to the predetermined positions in the bore hole 33 by sliding of the fixing guide member 63. Since the fixing guide member 63 includes the wheeled centerizer 84, the assembly of the measuring object 61 and the displacement measuring apparatus with the fixing guide member 63 can be smoothly moved within the bore hole 33. During movement of the assembly of the measuring object 61 and the displacement measuring apparatus 62, the bore hole television camera 86 picks up the image of the peripheral wall of the bore hole 33 for visual display, and an accurate position of the crack 32 can be detected.

Once an accurate position of the crack 32 is detected by means of the bore hole television camera 86, the fixing guide member 63 is pulled back a predetermined stroke. Then, the positions of the measuring object 61 within the rock 31a at one side of the crack 32 and the displacement measuring equipment 62 within the rock 31b at the other side of the crack 32 are adjusted to place them their respective predetermined positions. Thereafter, the hydraulic pressure applied to the expanding and contracting device of the fixing rod 66 is drained so that the spring therein overcomes the hydraulic force to retract the fixing pins 68 away from the engaging holes 83, and at the same time, to protrude the hole wall abutment 69 to establish pressure contact thereon. Accordingly, the engagement between the fixing pins 68 and the engaging holes 83 is released to place the measuring object 61 and the displacement measuring equipment 62 free from fixing guide member 63. Simultaneously, abutment of the hole wall abutment onto the peripheral wall surface of the bore hole 33 in cooperation with the supporting legs 74 causes the measuring object 61 and the displacement measuring apparatus 62 to be rigidly fixed at the respective predetermined positions in the bore hole 33. By this, installation of the three-dimensional displacement measuring system 60 is completed.

Attention should be given to the fact that the measuring object 61 and the displacement measuring apparatus 62 are held in the fixed position on the fixing guide member 63 until the three-dimensional displacement measuring system 60 is set in the bore hole 33. In this manner, the relative position between the measuring object 61 and the displacement measuring apparatus 62 are maintained at fixed condition. By this, narrowing of the measuring range, an off set out of measuring range and error in measurement of the LVDT displacement sensor 72 due to an offset of the initial fixing position can be successfully avoided.

The fixing guide member 63, which is released from the measuring object 61 and the displacement measuring apparatus 62 as the latter is fixed in the bore hole 33, is removed together with the bore hole television camera 86 via the extension rod 85.

When the rock 31a displaces relative to the rock 31b mating across the crack 32, the measuring object 61 also displaces relative to the displacement measuring equipment 62. This relative displacement appears as displacement of any one or more of the three surfaces 65 of the surface members 65a and 65b to cause shifting of the corresponding measuring element or elements 79. Thus, by monitoring displacement of the three surfaces 65 by three LVDT displacement sensors 72, the relative displacement of the foundation positioned across the crack 32 can be monitored with high precision. As set forth above, the LVDT displacement sensors 72 of the displacement measuring equipment 62 are connected to the amplifiers of the LVDT displacement sensors 72, the A/D converter, the CPU performing measurement control and data file management, the data recording memory and so forth. Therefore, the behavior of the crack can be monitored automatically for a long period.

It should be noted that when a predetermined period has elapsed and measurement is completed, the hole wall abutments 69 are released from engagement with the peripheral wall of the bore hole. Then, the three-dimensional displacement measuring system 60 can be recovered from the bore hole via the pressure line 67. Here, when a step is formed in the bore hole 33 due to deformation of the rocks, the displacement measuring apparatus 62 may be separated from the measuring object 61 so that the apparatus 62 may be solely recovered.

It should be noted that although the shown embodiment employs three mutually perpendicularly intersecting surfaces for monitoring three-dimensional behavior of the crack 32, it is naturally possible to employ more surfaces for measuring displacement.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set forth above, but to include all possible embodiments within the scope encompassed by, and equivalents thereof, the features set forth in the appended claims.

What is claimed is:

1. A method of measuring three-dimensional displacement of a mass, comprising the steps of:

providing a displacement indicating means comprising a first cylindrical member for indicating at least a fraction of three-dimensional displacement of the mass by arranging the first cylindrical member at one side of a discontinuous surface of the mass in a bore hole in the mass, the bore hole extending across the discontinuous surface of the mass;

arranging a measuring means for measuring displacement so as to be free to displace relative to said mass and in opposition to said displacement indicating means; and measuring relative three-dimensional displacement of the mass by detecting displacement of the displacement indicating means relative to the measuring means with the measuring means.

2. The method of claim 1, wherein the displacement indicating means comprises at least three surface members mounted on an end surface of the first cylindrical member oriented in respective mutually perpendicular directions.

3. The method of claim 2, wherein the measuring means comprises at least three displacement measuring devices arranged at another side of the discontinuous surface opposite to respective ones of the three surface members and said step of measuring comprises directly detecting displacement of the respective corresponding surface members with the respective displacement measuring devices.

4. The method of claim 3, wherein the mass is rock, the discontinuous surface is a crack in the rock, and said step of measuring comprises measuring displacement of the rock at the crack by measuring displacement of the surface members with the respective corresponding displacement measuring devices.

5. The method of claim 3, wherein said step of arranging a measuring means comprises mounting the displacement measuring devices in a second cylindrical member and positioning the second cylindrical member at the other side of the discontinuous surface.

6. The method of claim 5, and further comprising the step of fixing the first and second cylindrical members on a guide so as to form an assembly and fix the first and second cylindrical members relative to each other and prevent relative displacement, wherein said steps of providing the displacement indicating means and arranging the measuring means comprise:

inserting the assembly into the bore hole;

shifting the assembly within the bore hole so as to position the first cylindrical member on the one side of the discontinuous surface and the second cylindrical member on the other side of the discontinuous surface;

releasing the first and second cylindrical members from the guide and fixing the first and second cylindrical members in the bore hole; and removing the guide from the bore hole.

7. A three-dimensional displacement measuring system, comprising:

a displacement indicating means comprising a first cylindrical member for indicating at least a fraction of three-dimensional displacement of a mass when the first cylindrical member is arranged at one side of a discontinuous surface of the mass in a bore hole extending across the discontinuous surface; and a measuring means arrangeable so as to be free to displace relative to the mass and in opposition to said displacement indicating means for measuring relative three-dimensional displacement of the mass by detecting displacement of said displacement indicating means relative to said measuring means with said measuring means.

8. The system of claim 7, wherein said displacement indicating means comprises at least three surface members mounted on an end surface of said first cylindrical member oriented in respective mutually perpendicular directions.

9. The method of claim 8, wherein said measuring means comprises at least three displacement measuring devices arrangeable at another side of the discontinuous surface opposite to respective ones of said three surface members for directly detecting displacement of the respective corresponding one of said surface members with respective ones of said displacement measuring devices.

10. The system of claim 9, wherein said displacement measuring devices comprise at least one differential transformer displacement sensor in contact with one of said surface members.

11. The system of claim 10, wherein said differential transformer displacement sensor comprises a plurality of measuring elements to be constantly maintained in contact with said surface members and a differential transformer portion connected to said measuring elements.

12. The system of claim 9, wherein said displacement measuring devices are mounted in a second cylindrical member positionable at the other side of the discontinuous surface.

13. The system of claim 12, wherein said first and second cylindrical members comprise a fixing means for fixing said first and second cylindrical members within the borehole by press fitting said first and second cylindrical members onto a peripheral wall surface of the bore hole.

14. The system of claim 13, wherein said fixing means comprises a fixing rod extending slidably and radially through each of said cylindrical members.

15. The system of claim 14, wherein each said fixing rod of said fixing means comprises a hydraulic force drive system.

16. The system of claim 15, and further comprising a guide means for guiding said first and second cylindrical members in the bore hole in a position in which said first and second cylindrical members are fixed on said guide means and relative displacement between said first and second cylindrical members is restricted, each of said first and second cylindrical members being fixed on said guide means by a respective said fixing rod.

17. The system of claim 16, wherein said guide means comprises a plate member having engaging holes, said cylindrical members being fixed on said plate member by having one end of each said fixing rod engaged in said engaging holes.

18. The system of claim 17, wherein said guide means further comprises an extension rod connected to said plate member.

19. The system of claim 17, wherein said fixing means comprising each said fixing rod is operable to control hydraulic force supplied to each said fixing rod to slide each said fixing rod from engagement with said engaging holes to release each said fixing rod when said first and second cylindrical members have been guided to predetermined opposite positions across the discontinuous surface.

20. The system of claim 19, wherein said fixing means is operable to cause projection of the other end of each said fixing rod when each said fixing rod is slid from engagement with a respective said engagement hole in order for the other end of each fixing rod to press fit on the peripheral wall surface of the bore hole.

21. The system of claim 16, wherein said guide means comprises a monitoring means for monitoring the position of said first and second cylindrical members with respect to the discontinuous surface.

22. The system of claim 21, wherein said monitoring means comprises a bore hole television.

23. The system of claim 16, wherein said guide means comprises a wheeled centerizer.

24. The system of claim 14, wherein said fixing means further comprises supporting legs on external surfaces of said first and second cylindrical members, said supporting legs being cooperative with said fixing rod to be capable of fixing said cylindrical members within the bore hole.

25. A method of measuring three-dimensional displacement of a mass having an end surface, comprising the steps of:
- providing a displacement indicating means on the end surface of the mass for indicating at least a fraction of three-dimensional displacement of the mass;
- arranging a measuring means for measuring displacement so as to be free to displace relative to the mass and in opposition to the displacement indicating means;
- measuring relative three-dimensional displacement of the mass by detecting displacement of the displacement indicating means relative to the measuring means with the measuring means;
- wherein the displacement indicating means comprises a concave surface formed by a curved surface that converges from an opening end to a bottom end;
- wherein the displacement measuring means comprises a displacement measuring device arranged opposite to the concave surface that, in said step of measuring, measures the relative distance to the concave surface along a circumferential trace by rotating about a center axis of the concave surface while maintaining a tilt angle relative to the center axis so as to circumferentially scan the concave surface;
- analyzing the displacement of the circumferential trace on the concave surface associated with the displacement of the mass on the basis of the relative distance measured by the displacement measuring device;
- wherein the mass comprises a first cylindrical member arranged at one side of a discontinuous surface in a bore hole formed across the discontinuous surface, and the displacement measuring device comprises a second cylindrical member positioned at the other side of the discontinuous surface, the displacement measuring device measuring the displacement of the first cylindrical member relative to the second cylindrical member across the discontinuous surface; and
- wherein the discontinuous surface is a crack in a rock, the displacement of the rock at the crack being measured by measuring the displacement of the first cylindrical member relative to the second cylindrical member.

26. A three-dimensional displacement measuring system for measuring displacement of a mass, comprising:
- a displacement indicating means on an end surface of the mass for indicating at least a fraction of three-dimensional displacement of the mass;
- a measuring means arranged so as to be free to displace relative to the mass and in opposition to said displacement indicating means for measuring relative three-dimensional displacement of the mass by detecting displacement of said displacement indicating means relative to said measuring means with said measuring means;
- wherein said displacement indicating means comprises a concave surface formed by a curved surface that converges from an opening end to a bottom end;
- wherein said displacement measuring means comprises a displacement measuring device arranged opposite to said concave surface for measuring the relative distance to said concave surface along a circumferential trace by rotating about a center axis of said concave surface while maintaining a tilt angle relative to the center axis so as to circumferentially scan said concave surface;
- means for analyzing the displacement of the circumferential trace on said concave surface associated with the displacement of the mass on the basis of the relative distance measured by said displacement measuring device;
- wherein the mass comprises a first cylindrical member arranged at one side of a discontinuous surface in a bore hole formed across said discontinuous surface, and said displacement measuring device comprises a second cylindrical member positioned at the other side of said discontinuous surface; and
- wherein said bore hole is formed in a rock and said discontinuous surface is a crack in the rock.

* * * * *